United States Patent [19]
Jacobson

[11] 4,339,819
[45] Jul. 13, 1982

[54] PROGRAMMABLE SEQUENCE GENERATOR FOR IN-CIRCUIT DIGITAL TESTING

[75] Inventor: Robert G. Jacobson, Brentwood, Calif.

[73] Assignee: Zehntel, Inc., Walnut Creek, Calif.

[21] Appl. No.: 160,562

[22] Filed: Jun. 17, 1980

[51] Int. Cl.³ .................... G01R 31/28; G06F 11/00
[52] U.S. Cl. .................... 371/16; 324/73 R; 364/200; 371/20
[58] Field of Search .................... 371/16, 20; 364/200; 324/73 R

[56] References Cited

U.S. PATENT DOCUMENTS

| | | | |
|---|---|---|---|
| 3,916,178 | 10/1975 | Greenwald | 371/16 |
| 4,125,763 | 11/1978 | Drabing et al. | 371/20 |
| 4,127,768 | 11/1978 | Negi et al. | 371/16 |
| 4,128,873 | 12/1978 | Lamiaux | 371/20 X |
| 4,200,224 | 4/1980 | Flint | 371/16 X |
| 4,216,539 | 8/1980 | Raymond et al. | 371/20 |

Primary Examiner—Jerry Smith
Attorney, Agent, or Firm—Arnold, White & Durkee

[57] ABSTRACT

A circuit for use in an in-circuit digital tester for generating data bus and control line test signals to test the electrical performance properties of components in a circuit under test is disclosed. Certain components in a circuit under test, such as microprocessors, are bus oriented devices which perform their functions in predetermined cycles. These cycles have been divided up into control signals and data bus signals. Each sequence of control signals are referred to as a protocol sequence. Each test pin in the bed of nails test fixture has a digital test signal generator associated therewith. The present invention operates to program each test signal generator with digital test signal generating data to produce each protocol sequence of the device under test. Test cycles are then run in which a predetermined sequence of protocol sequences are generated to test the device. This predetermined sequence in protocol sequences is specified by a sequence in starting addresses of the various protocol sequences programmed into the generators.

24 Claims, 13 Drawing Figures

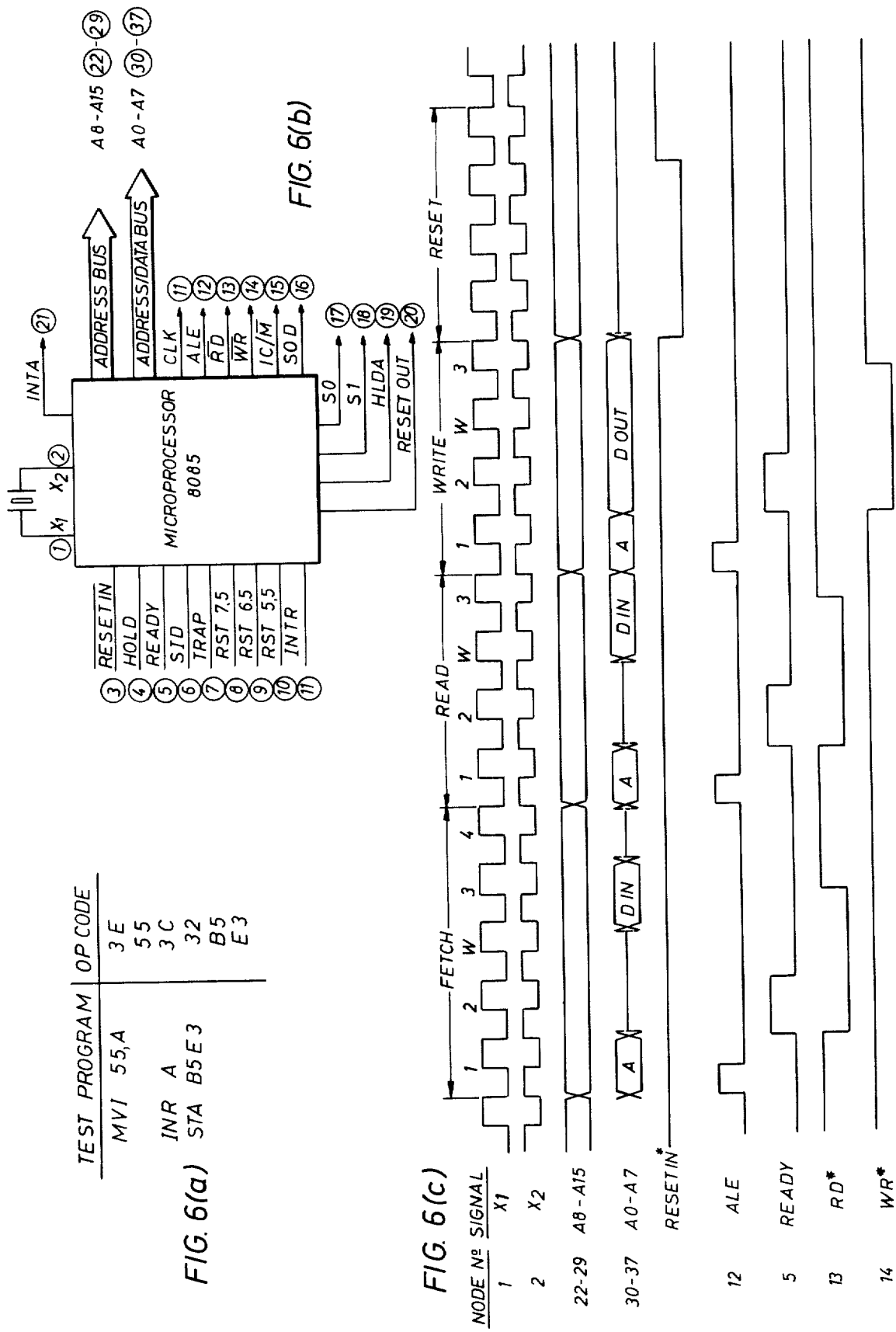

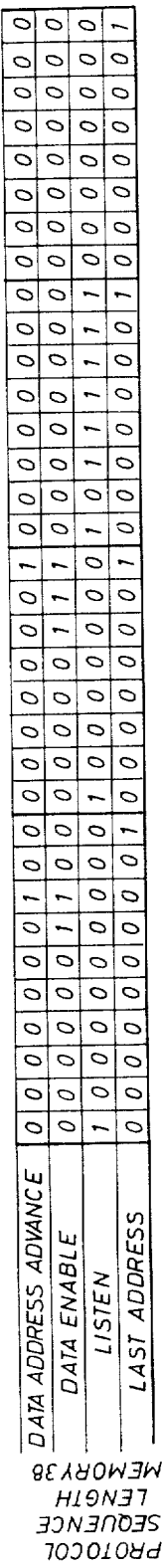
FIG 7(c)
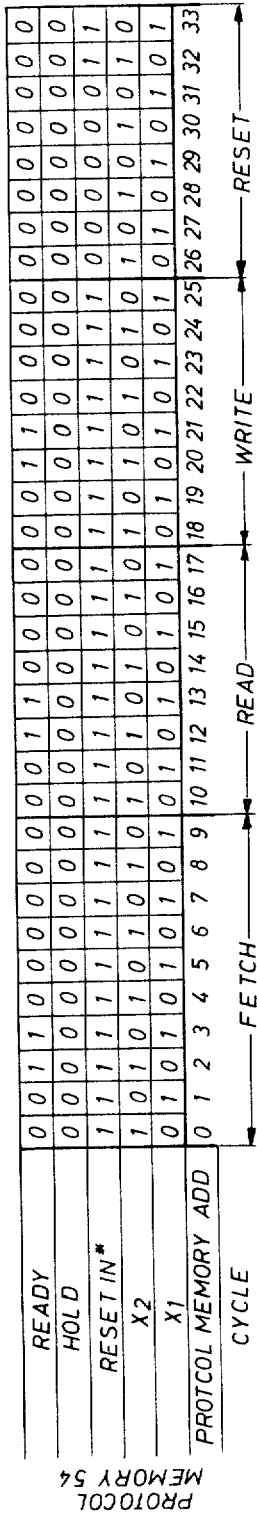
FIG. 7(b)
FIG. 7(a)

PROGRAMMABLE SEQUENCE GENERATOR FOR IN-CIRCUIT DIGITAL TESTING

TABLE OF CONTENTS

BACKGROUND OF THE INVENTION
SUMMARY OF THE INVENTION
BRIEF DESCRIPTION OF THE DRAWINGS
DETAILED DESCRIPTION OF THE PREFERRED EMBODIMENT
  An In-Circuit Digital Tester
  The Protocol Control-Data Concept
  The Programmable Sequences Generator
    The Protocol/Data Driver/Receiver Boards 22
    The Programmable Sequence Controller 18
    Buffer Memory 40 and Synchronization Means 42
  A Sample Test Program
WHAT IS CLAIMED

BACKGROUND OF THE INVENTION

This invention relates to in-circuit digital testers. More particular, the invention relates to a circuit for generating test signals for testing bus oriented electronic components, such as microprocessors.

As used herein, an in-circuit digital tester refers to a tester that is capable of testing a circuit without regard to whether or not the electrical node into which a test signal is injected is connected to the output of another logic device. In-circuit testers are capable of generating and applying a digital test signal to an output node of a logic device that is normally at a logic ground to cause that output to go to a logic high without damaging the device. In other words, the use of the term "in-circuit" means that the device or circuit under test does not have to be isolated or removed from the surrounding circuits in order to apply test signals and to monitor its output.

Prior-art in-circuit digital testers, such as that disclosed in U.S. Pat. No. 4,216,539 which is assigned to the assignee of the present application, and which is hereinafter incorporated for all purposes, provides a digital test signal generator with each pin in a bed of nails fixture capable of generating a wide variety of digital test signals to test components in a circuit under test. Some components however, require an especially complexed test signal pattern generation in order to adequately test the electrical performance characteristics of the component. One such component is a microprocessor chip. Such components are generally bus oriented devices requiring the generation of multi-lined data bus signals which may represent data or may represent addresses. In addition, to properly exercise or set up a data bus signal generation sequence, a sequence of control signals must precede or be generated concurrently with the data bus signals before the microprocessor can properly execute its internal sequences. Because the microprocessor performs all of its instructions using repeated selected signal sequences, such as an instruction fetch cycle, a read from memory cycle, a write to memory cycle, etc., in order to generate these required complex test signal patterns and to generate them in lengthy patterns, some means must be provided for minimizing the amount of pin memory needed to store the test signal generating data that will be used during the test cycle to generate the required test signal patterns.

To solve the problem of generating these complexed test signal patterns while utilizing the advantages and novelty over the prior-art for in-circuit digital testers offered by the invention disclosed in the application incorporated above, the present invention has segregated the test signals for bus oriented devices into two categories—data bus signals and protocol or control test signals. The data bus signals are applied as parallel words onto the multi-lined data buses, functioning either as data or as addresses. A plurality of individual control signals are generated in timed relationship such that when all the control signals are viewed in parallel, they define a protocol sequence which communicates to a device the necessary information for the device to perform a normally intended function. From these predefined protocol sequences, all of the functions of the device may be exercised by recursively generating the protocol sequences as required to test each function of the device.

SUMMARY OF THE INVENTION

In accordance with the present invention, a circuit for use in an in-circuit digital tester for generating data bus and control input test signals to test bus oriented electrical components of a circuit under test is disclosed. The circuit is comprised of a data memory for storing data bus test signal generating data for a plurality of data bus signal lines. The data bus signal generating data is outputted from the data memory in response to a predetermined sequence of data memory addresses.

A control memory is also provided for storing control line test generating data for a plurality of protocol sequences in which each protocol sequence is defined by a plurality of control line test signals. The control line test signals will be generated in response to a predetermined sequence of control memory addresses. Each protocol sequence stored in the control memory begins with a starting address and ends at a last memory address. To generate the predetermined sequences in the addresses applied to the data memory and to the control memory, a controller unit is provided. The controller generates selected ones of the protocol sequences by generating a predetermined sequence of starting addresses for the control memory. The controller further enables the generation of the data bus signals specified by the data bus test signal generating data stored in the data memory.

The controller is comprised of a programmed processor including a random access memory unit for storing instructions which, when executed by said processor, will output the predetermined sequence of starting addresses of the protocol sequences to be generated. The controller further includes a buffer memory unit connected to the output of the processor for temporarily storing and outputting, in the same sequence as outputted by the processor, the starting addresses of the protocol sequences. The buffer memory unit generates a run command signal to the programmed processor unit when the buffer memory unit is not full. The controller further includes a control memory address counter, a sequence length memory, a data memory address counter and a synchronization means.

The control memory address counter responds to the output from the buffer memory to generate the control memory addresses. The sequence length memory responds to the control memory addresses to output enabling signals that will enable the generation of the predetermined sequences of both the control and the data memory addresses. The enable signals include a last address signal to enable the control memory address counter to load the next protocol sequence starting address from the buffer memory; a data memory enable signal to selectively enable the data memory to generate the data bus test signals; and a data memory address advance signal to enable said data memory address counter to advance to the next data memory address in the predetermined sequence of data memory addresses. The data memory address counter responds to said sequence length memory enable signals to generate the data memory addresses. The primary function of the synchronization means is to respond to the last address signal to update the control memory address counter with the starting address of the next protocol sequence to be generated.

The present invention is intended to be used in an in-circuit digital testing system adapted for use with a central processing unit in which the in-circuit tester includes a response signal line from monitoring a digital response test signal from a circuit under test. Also included is a functional tester, a set of test pins for contacting the electrical nodes of the circuit under test, a plurality of programmed-memory digital test-signal generators and a response signal selecting means. The functional tester performs functional tests on the signal that appears on the response signal line during a test cycle. The results of the functional test are analyzed by the central processor to determine the electrical performance properties of the components of the circuit under test.

The set of test pins are used to contact selected electrical nodes of the circuit under test to provide the input and output signal points of the circuit under test. A programmed-memory digital test-signal generator is provided for each test pin in the set of test pins. Each generator is capable of generating an input signal-point digital test signal for the circuit under test. The response signal selecting means selectively connects the signal on one of the test pins to the response signal line as the response signal for the functional tester. The present invention is an improvement in the programmed-memory digital test-signal generators.

BRIEF DESCRIPTION OF THE DRAWING

For a fuller understanding of the nature and objects of the invention, reference should be had to the following detailed description taken in connection with the accompaying drawings, in which:

FIG. 6(a) is an illustration of a test program for testing the microprocessor illustrated in FIG. 6(b);

FIG. 6(b) is a block diagram of a microporcessor showing its control signal and data bus signal pin assignments;

FIG. 6(c) is a timing diagram of the control and data bus signals for various cycles of the microprocessor illustrated in FIG. 6(b);

FIG. 7(a) is an illustration of the programmable sequence generator controller program memory contents which enable the program controller to execute the illustrated program in FIG. 7(a);

FIG. 7(b) is a memory map of the data and sequence length memories to generate the timing signals illustrated in FIG. 6(c);

FIG. 7(c) is a memory map of the data memory shown in FIG. 2; and

FIG. 7(d) is an illustration of the contents of a typical data memory for generating the data bus test signals needed to simulate the specific microprocessor program illustrated in FIG. 6(a).

Similar reference numerals refer to similar parts throughout the several views of the drawings.

DETAILED DESCRIPTION OF THE PREFERRED EMBODIMENT

An In-Circuit Digital Tester

Figure 1:
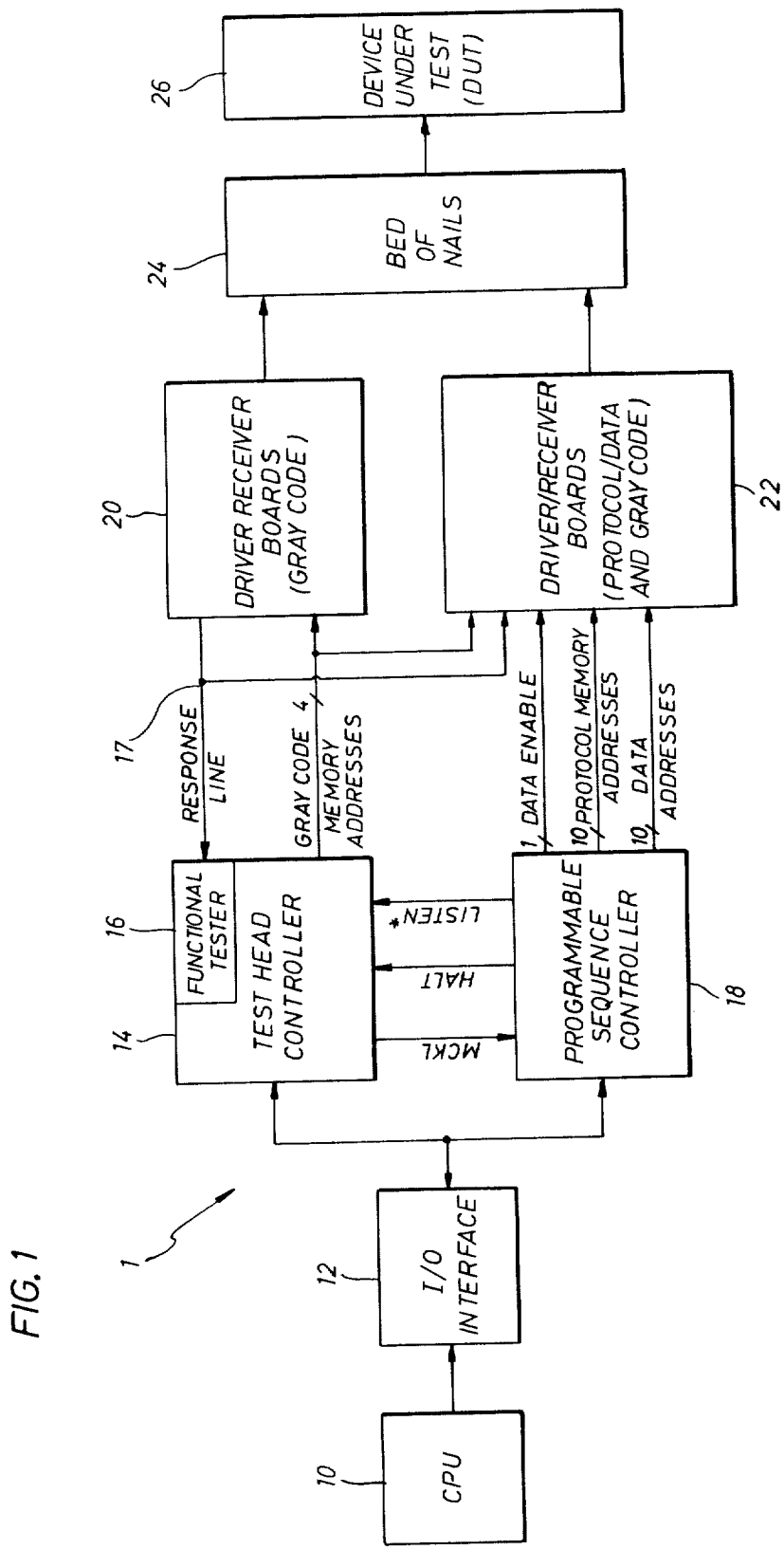
FIG. 1 is a blocked diagram of the in-circuit digital tester in which the present invention is used.

Referring to the figures and first to FIG. 1, a functional block diagram of an in-circuit digital tester 1 which includes the present invention is shown. In operation, the in-circuit digital tester 1 illustrated in FIG. 1 generates a test cycle in which selected electrical nodes of a device under test (DUT) 26 are stimulated with preselected digital test signals generated by a plurality driver/receiver boards 20, 22. The digital test signals generated by the driver/receiver boards are applied to the selected electrical nodes of the DUT 26 through a bed of nails fixture 24 on which the DUT 26 has been placed. Controlling the generation of the digital test signals by the driver/receiver boards 20, 22 is the test head controller 14 and the programmable sequence controller 18.

There are two possible modes of operation of the driver/receiver boards 20, 22, a Gray code mode or a protocol/data mode. Not all of the driver/receiver boards can operate in the protocol/data mode, but all of the driver/receiver boards are capable of operating in the Gray code mode. For purposes of discussion, driver/receiver boards 22 are the only boards which can operate in both modes. U.S. Pat. No. 4,216,539 which is incorporated herein by reference discloses an in-circuit digital tester which operates with Gray code test signals. The present invention operates in conjunction with that in-circuit digital tester to provide an extension to the digital test signal generation capabilities to more easily accommodate the test signal patterns required to test bus oriented devices, such as microprocessors, even though to some extent it is possible using the Gray code test signals to generate such patterns. While the present invention is disclosed and discussed in relation to the unique testing capabilities of bus oriented devices, such as microprocessors, the present invention is equally capable of generating test signals for any variety of digital logic devices.

To more easily accommodate the more complexed test signal pattern generation requirements of bus oriented devices, a programmable sequence controller 18, operating in association with driver/receiver boards 22, is included in the in-circuit digital tester 1 illustrated in FIG. 1. The present invention takes advantage of the fact that each test pin in the bed of nails 24 has associated with it a pin memory for storing test signal generating data to produce any desired test signal for each test pin in the bed of nails.

Included in the test head controller 14 is a functional tester 16 that performs any one of several preselected tests on the signal appearing on the response signal line 17. Included in the driver/receiver boards 20, 22 is a selection means for selecting the signal on one of the electrical nodes of the circuit under test as the signal to be applied to the response signal line 17. The functional tester 16 will perform its functional test on the response line 17 when the enable signal LISTEN* is at a logic zero. LISTEN* is generated by the programmable sequence controller 18 and is applied to the test head controller 14. Internal to the test head controller 14 is a similar LISTEN signal that is combined with the LISTEN* signal generated from the controller 18 to enable the functional tester 16 to "listen" to the signal to response line 17. If the in-circuit tester operates in the protocol/data mode, the programmable sequence controller 18 will generate a HALT command to the test head controller 14 when the test cycle is over. In other words, the test head controller 14 will generate a test cycle in its normal manner. However, the programmable sequence controller 18, when in the protocol/data mode, produces the signal HALT which terminates the test cycle when the predetermined sequence of protocol and data test signals have been generated.

Supervising the generation of the test cycle and selecting the various digital test signals to be generated during the test cycle is central processing unit (CPU) 10. CPU 10 communicates with the test head controller 14 and programmable sequence controller 18 via the I/O innerface 12. Prior to the start of a test cycle, the CPU 10 will transmit to the pin memories located on the driver/receiver boards 20, 22 the necessary digital test signal generating data that will be required during the test cycle. Additionally, test cycle information, such as the length of the test cycle, the particular functional test to be performed by the functional tester 16, the clocking signal frequency MCKL, and other data is provided to the test head controller 14. If the test cycle is to be run in the protocol/data mode, the necessary information to select the protocol sequence and to generate the sequences in pin memory addresses to generate the desired waveforms is forwarded to the programmable sequence controller 18.

Upon command from the CPU 10, the test cycle will be generated during which the various digital test signals needed will stimulate the preselected inputs of the DUT 26 to thereby produce a response on response line 17. At the completion of the test cycle, the results of the functional tester 16 is transmitted via the I/O interface 12 to the CPU 10 for further processing. To produce the Gray code test signals in driver/receiver boards 20, 22 a set of Gray code memory addresses are generated by the test head controller 14. These Gray code memory addresses are applied to both driver/receiver boards 20, 22. To produce protocol/data test signals during a test cycle, a set of protocol/data memory addresses are produced by the programmable sequence controller 18, but these addresses are applied only to the driver/receiver boards 22. Appropriate address selection circuits are provided on driver/receiver boards 22 to select between the pin memory addresses from test head controller 14 and the programmable sequence controller 18 to output from the pin memories the pre-programmed digital test-signal generating data stored therein.

The Protocol Control-Data Concept

Turning now to FIG. 6(b), a block diagram for a microprocessor chip, such as that manufactured by Intel Corporation as its Model 8085 microprocessor, is shown with the various input and output signal points labeled. To the external world of the microprocessor chip viewed from the signals appearing on these various input and output signal points, the internal operations of the microprocessor will appear very much as that shown in the timing diagram of FIG. 6(c). FIG. 6(c) illustrates the digital signals that will appear on several of the input/output pins of the microprocessor chip when the microprocessor is performing its normal functions. For example, four different cycles performed by the microprocessor illustrated in FIG. 6(b) are illustrated in FIG. 6(c). A memory fetch cycle is shown in which the microprocessor "fetches" from memory the contents of a particular main memory location.

In order to accomplish this function, the microprocessor must first output an address onto the address bus A0-A15 during the initial portion of the fetch cycle. That address would normally be received by the main memory unit bused to the microprocessor. The function of main memory is to store the instructions and data needed by the microprocessor. At the proper time in the fetch cycle, the data contained in the specified memory location should then appear on the data bus portion of the address bus A0-A7 as input signals to the microprocessor. When the RD* (read command) transitions to the logic high state, the data appearing on the address/data bus A0-A7 are strobed into the microprocessor, thus complete the fetch cycle.

Also illustrated in the FIG. 6(c) timing diagram is a read cycle and a write cycle by the microprocessor. For the read cycle, the microprocessor outputs an address onto the address bus A0-A15 once again to specify a memory location in the main memory from which the data is to be read. At the appropriate time in the read cycle, the data contained in the specified memory location will be available on the data bus portion of the address bus A0-A7 and will be strobed into the microprocessor by the RD* signal. For the write cycle, the microprocessor outputs onto the address bus A0-A17, the address of the memory location into which data is to be written. Following the address onto the address lines A0-A15, the microprocessor outputs the data to be stored onto the data bus portion A0-A7 of the address bus. At the appropriate time in the write cycle, the WR* (write command) signal will be generated to normally cause the main memory unit to strobe the data appearing on the address/data bus A0-A7 into the previously specified memory location. Finally, a reset cycle is shown in FIG. 6(c) in which a RESET IN* is generated to the microprocessor to initialize the internal circuits of the microprocessor so that any of the other cycles can then be initiated.

In order to exercise the microprocessor 8085 "in-circuit", it is necessary that digital test signals are generated as shown in FIG. 6(c) when anyone of the four illustrated cycles are required. The particular microprocessor being tested and its particular instruction set will dictate which and in what order the various cycles of the processor will be generated in order to test the various capabilities of the device. The programmable sequence generator of the present invention has divided the various test signals needed to test a bus oriented device, such as a microprocessor, into two categories—protocol control signals (hereinafter control signals) and protocol data bus signals (hereinafter data signals).

Still referring to FIG. 6(c) each of the four microprocessor cycles illustrated, the fetch cycle, the read cycle, the reset cycle and the write cycle are each referred to hereinafter as protocol sequences. The signals appearing on address bus signal lines A0–A15 (address/data bus A0–A7) are the data signals, with all other input/output signals comprising the control signals. To perform selected protocol sequences, not every one of the control signals need be generated. For example, the protocol signals X1, X2, READY and RESET* comprise all of the control signals which must occur in a predetermined order during each of the protocol sequences illustrated in FIG. 6(c).

By defining the particular timing sequence of each of the control and data signals required by the microprocessor during each protocol sequence and by programming into the pin memory units associated with each of the test signal generators of the bed of nails fixture 24 test signal generating data to generate each sequence, it is then possible to recursively generate any cycle of the microprocessor by simply specifying its starting and its last address in the pin memories. In other words, by sequentially generating a sequence of starting and last memory addresses any desired sequence in protocol sequences may be generated. In effect, the test signal generating data stored in the pin memories connected to the test pins function very much like a series of computer program subroutines which are sequentially called up by the programmable sequence controller 18 to generate the control and data signals required in each protocol sequence. An example of the use of the programmable sequence generator of the present invention to execute a test program for the microprocessor illustrated in FIG. 6(b) is given in the section below entitled "A Sample Test Program".

The Programmable Sequence Generator

The Protocol/Data Driver/Receiver Boards 22

Figure 2:
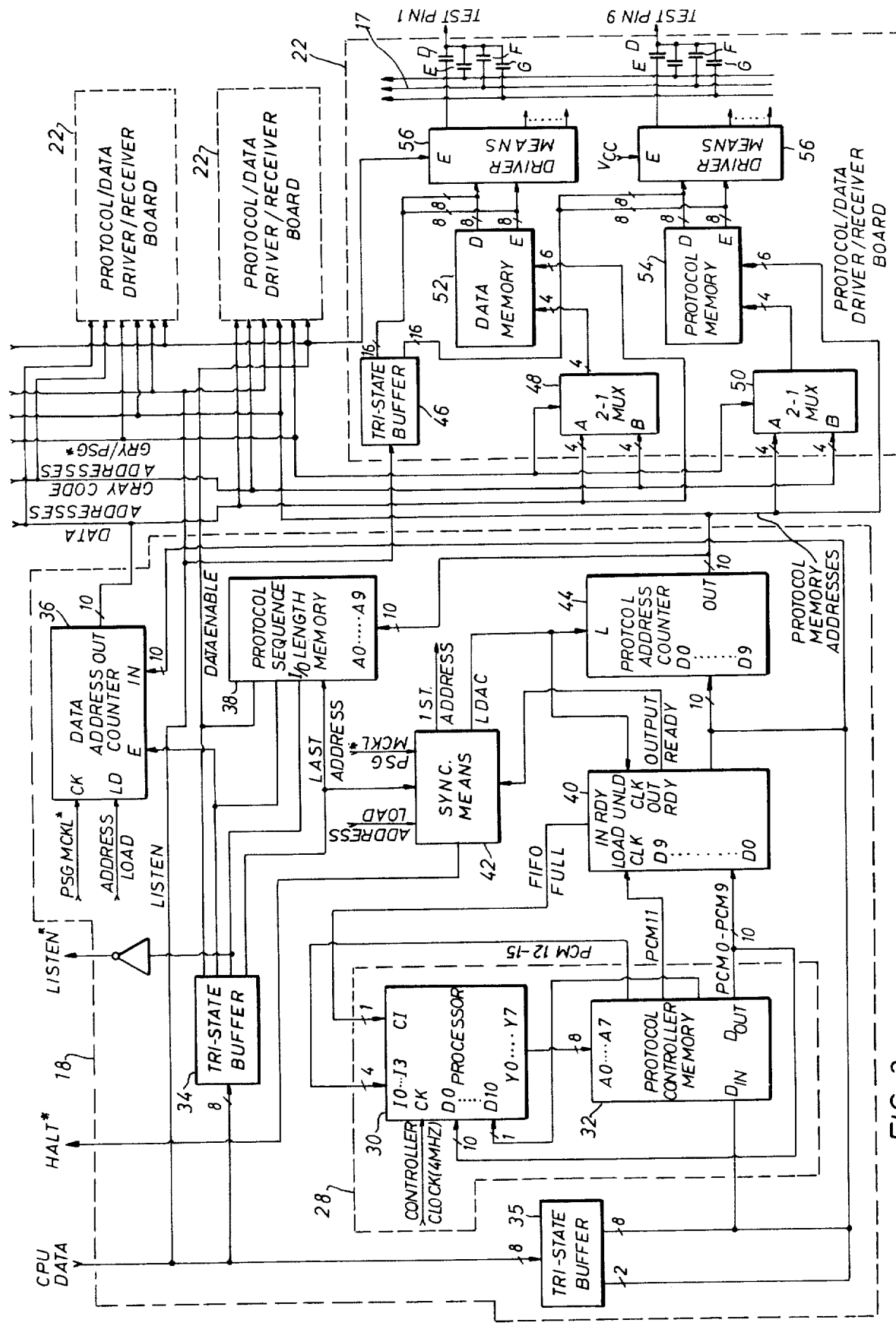
FIG. 2 is a more detailed blocked diagram of the programmable sequence generator and driver/receiver boards of the in-circuit digital tester shown in FIG. 1.

Referring now to FIG. 2, which illustrates a more detailed functional block diagram of the programmable sequence controller 18 and a driver/receiver board 22, each driver/receiver board 22 is capable of generating eight data bus signals and eight protocol control signals. As previously mentioned, each driver/receiver board 22 is capable of functioning both in the Gray code mode as well as the protocol/data mode for generating digital test signals for the 16 test pins associated with each driver/receiver board. In the protocol/data mode, eight of the test pins will receive data signals from the data memory 52, while the remaining eight test pins will receive protocol control test signals from the protocol memory 54. Associated with both the data memory 52 and the protocol memory 54 is a drive means 56 which will convert the digital test signal generating data from its respective memory into the logic levels which are applied to the DUT through a selectable D relay connected to each test pin. Also connected to each test pin are three additional selectable switches, the E, F and G switch. The E, F and G switches are all bused together such that the E, F and G switches for every driver/receiver board 20, 22 are connected to these three buses. The F bus functions as the response signal line 17.

To generate a test signal on the output of the driver means 56, an address is supplied to both the data memory 52 and to the protocol memory 54. Both the data and protocol memories output two bits of digital signal generating data for each addressed location to produce one digital test signal for each test pins associated with the particular driver/receiver board, regardless of which mode of operation is used. For the preferred embodiment of the present invention, both data memory 52 and protocol memory 54 have 1,024 memory locations, with each addressed memory location having 16 bits of digital information stored therein, 2 bits for 8 test signals. To address 1,024 memory locations, a 10-bit binary address is required.

Figure 4:
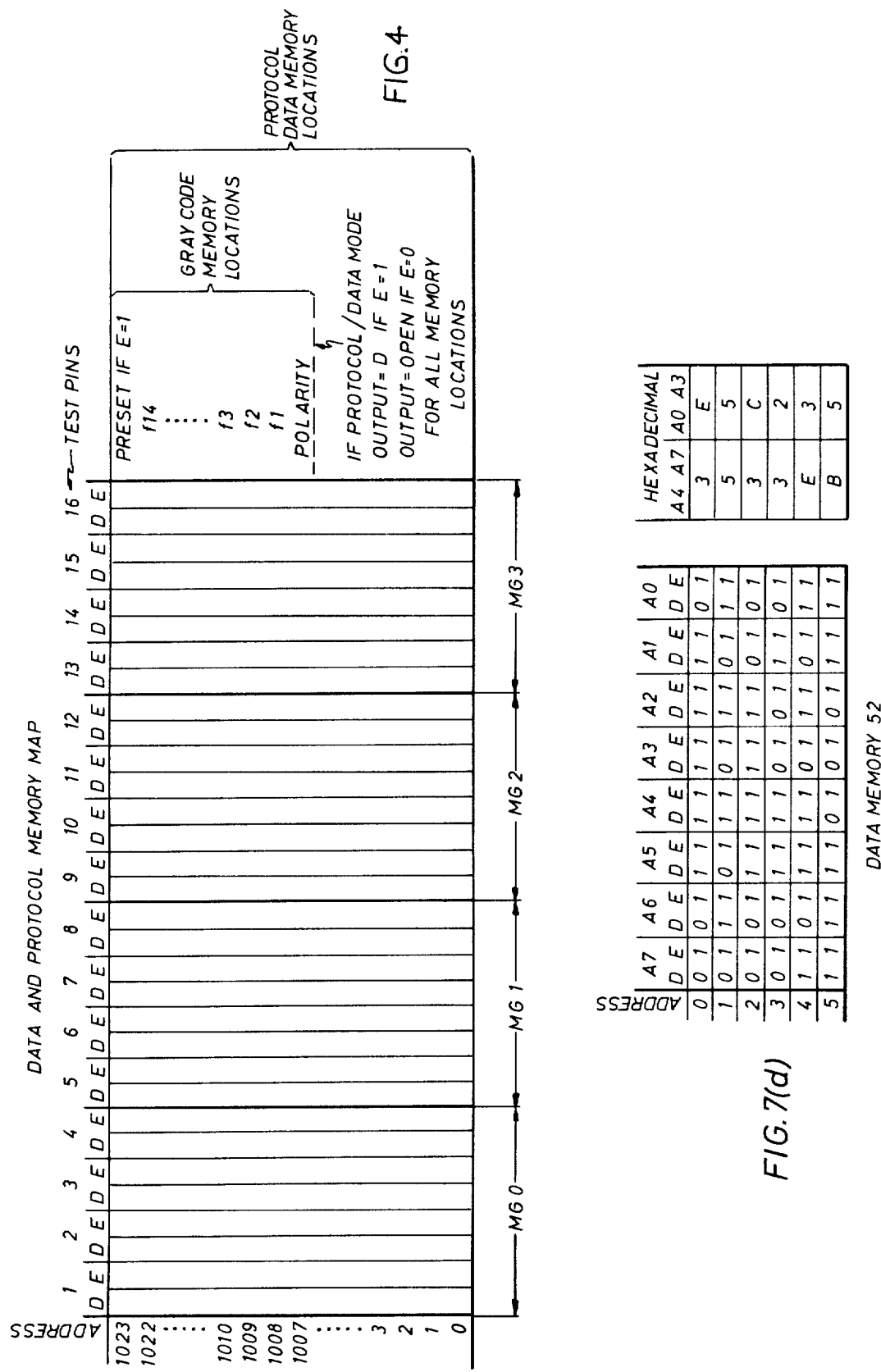
FIG. 4 is a pin memory map of the data and protocol memory units illustrated in FIG. 2.

As mentioned above, each driver/receiver board 22 can operate to generate either Gray code signals or to generate protocol control/data signals. FIG. 4 is an illustration of a data and protocol memory map for a typical driver/receiver board which generates up to 16 digital test signals. For both the driver/receiver boards 20, 22, when operating in the Gray code mode, only 16 memory locations are used in data memory 52 and protocol memory 54 to store the Gray code test signal generating data (memory locations 1023–1007 shown in FIG. 4). When operating in the protocol/data mode, all of the data and protocol memory addresses are available for storing the test signal generating data for both the data test signals and the control test signals.

As shown in FIG. 1, it is the test head controller 14 that produces the Gray code memory addresses. These addresses are applied to both types of driver/receiver boards 20, 22. Still referring to FIG. 2, the 4-bit Gray code memory addresses are applied to multiplex units 48 and 50 along with the four low order bits of the 10-bit protocol memory addresses outputted by the programmable sequence controller 18. When the driver/receiver boards 22 are to be operated in the protocol/data mode, the signal GRY/PSG* will be in the appropriate logic state to enable the 2-1 multiplexers 48, 50 to apply the four low order bits of the data addresses to the four low order address inputs of data memory 52 and the four low order bits of the protocol memory addresses to the four low order address inputs of the protocol memory 54. The remaining six higher order address bits from both the data addresses and the protocol memory addresses are applied through tri-state buffers (not shown) to the data memory 52 and the protocol memory 54, respectively. When operating in the Gray mode, these higher order address bits are held high. Accordingly, the 16 memory locations used to store the Gray code signal generating data are the last 16 memory locations. The data memory addresses and the protocol memory addresses are generated by controller 18 in a predetermined sequence to output digital signal generating data to the associated driver means 56 to produce the desires data bus signals and protocol control signals required to test the bus device under test.

Figure 3:
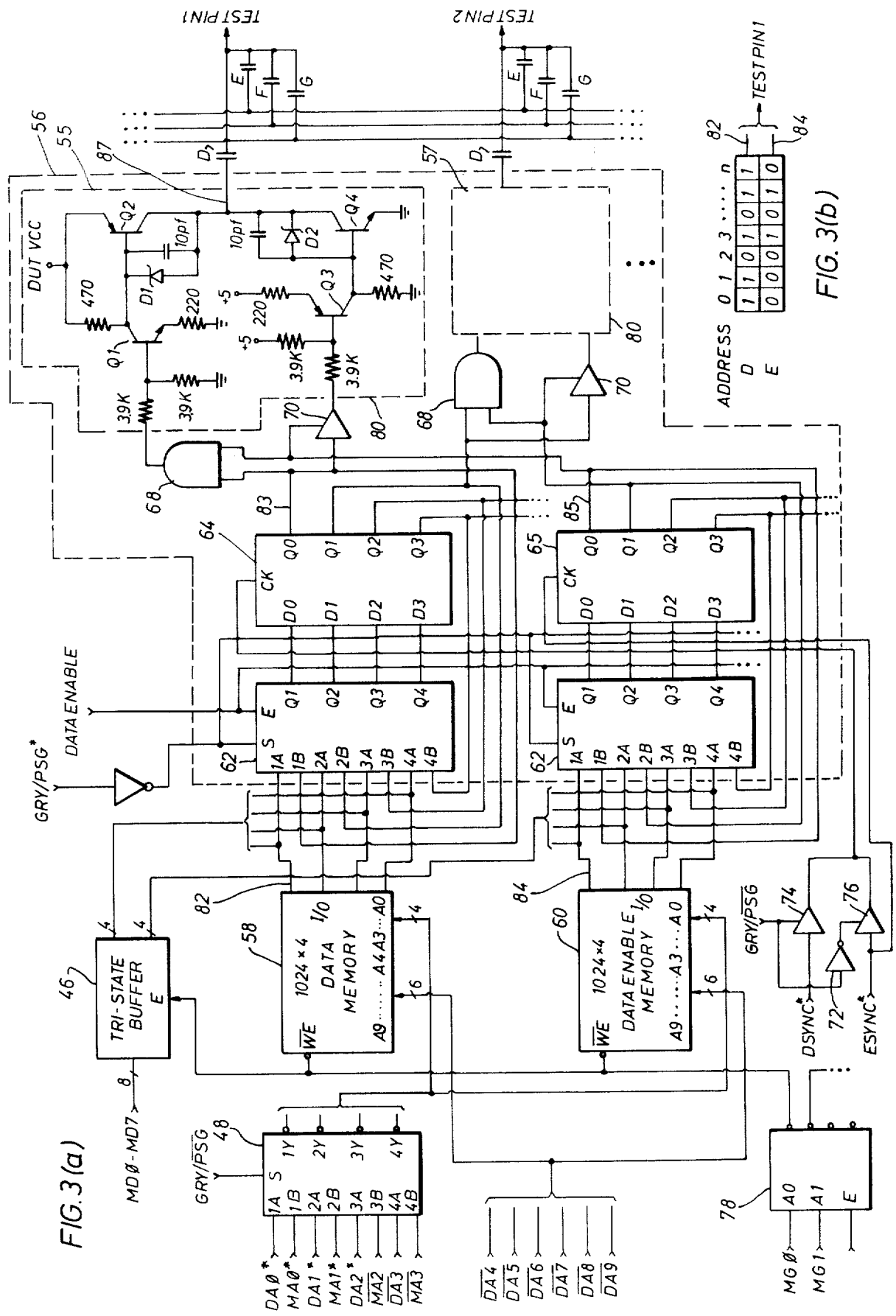
FIG. 3(a) is a more detailed circuit diagram of the data memory and driver means of the driver/receiver boards shown in FIG. 2.
FIG. 3(b) is an illustration of how the data bus signal generating data is stored in the data and data enable memories for generating the data bus test signals.

Turning now to FIG. 3(a), a more detailed circuit diagram of the data memory 52 shown in FIG. 2, two memory units, data memory 58 and data enable memory 60, which comprise a portion of data memory 52 are shown. Each memory unit 58, 60 is a 1,024×4 bit memory unit. As was previously mentioned, two bits of digital information are required by the driver means 56 in order to generate a single digital test signal. These two bits of information are referred to as the data bit and the data enable bit.

FIG. 3(b) is a memory map for a memory unit having n memory locations with two bits of digital information in each memory location. The address for each memory location is illustrated above the memory with the data (D) bit shown opposite the data enable (E) bit. The memory unit illustrated in FIG. 3(b) is illustrative of how the digital information from memory units 58 and 60 are combined to generate a digital test signal for test pin 1. That is, the data bit appears on line 82 and the data enable bit appears on line 84.

The preferred embodiment of the present invention has constructed data memory 52 and protocol memory 54 from memory chips having 1,024×4 bit arrangement. Accordingly, the memory units 58, 60 illustrated in FIG. 3(a) are capable of producing only 4 data bus test signals while each driver/receiver board 22 is capable of producing a total of 8. The circuit arrangement as illustrated in FIG. 3(a) is duplicated to produce the remaining 4 data signals. It would be obvious to a person of ordinary skill in the art having the teachings of the disclosure herein, could choose a different memory device having a different number of memory locations and a different number of bits per memory location to construct the present invention. For example, four 2-bit 1,024×2 bit memory units could be selected to duplicate the signal generating capacity of memory units 58, 60.

Still referring to FIG. 3(a), the respective digital signal generating data that is stored in data memory 58 and in data enable memory 60 are each applied to identical logic circuits comprised of AND/OR select gates 62 and quad latches 64. These two devices 62, 64 are connected in series, with the output from the quad latch 64 fed back as the B input to the AND/OR logic gates 62. The A inputs to gates 62 are the 4 bits from either the data memory 58 or the data enable memory 60. The function of logic gates 62 and latch 64 is as follows: First, when the driver/receiver board 22 is functioning in the Gray code mode, the logic level on line 83 is caused to change logic states each time that a logic 1 appears on the line 82 out of data memory 58 since the Gray code mode of operation requires that the generated digital output test signal change state each time that a logic 1 is read from the data memory 58.

When the driver/receiver board 22 is to be operated in the protocol/data mode the logic level that is generated on signal line 83 is intended to follow the logic level that is present on signal line 82 out of data memory 58. In other words, the logic level outputted by data memory 58 specifies the logic level that is produced on the output of driver amplifier 55 rather than specifying a transition in that digital signal as is the case in the Gray code mode. For both the Gray code and protocol/data modes, when a logic 1 appears on signal line 85, the logic level on signal line 83 is enabled to pass through driver amplifier 55 and appear on line 87 into the D selectable relay associated with test pin 1. The data enable data stored in memory 60 is then selected, depending on the mode of operation, to generate a logic 1 on the output from its associated latch 65 when output logic level is to be generated for that test signal.

Sequence controller 18 produces a further enable signal, DATA ENABLE, that is applied to each logic gate 62. DATA ENABLE, when true disables the combination of gates 62 and latches 64 from producing any logic signals out of its associated driver means 56. With this feature, it is possible to remove all the data bus test signals from the address/data bus lines of the device under test when the device itself is generating the logic level on these lines that the in-circuit tester desires to monitor. The selection of the mode of operation for the logic gates 62 is specified by the logic level of the signal GRY/PSG*, while the clock signal for quad latches 64 and 65 are supplied on the DSYNC and ESYNC signals respectively. For the presently preferred embodiment of the present inventions, the logic gates 62 are manufactured and sold by Monolithic Memories, Inc. as their PAL 14H4. This device is a programmable device equivalent to a 512×4 bit ROM. The programming of this device is provided as an Appendix at the end of this description.

The memory arrangement discussed with respect to the data memories 52 in FIG. 3(a), is identical to that for protocol memory 54 except that there is no enable signal generated by the controller 18 to disable the generation of the control signals from the driver means 56 associated with the protocol memory 54.

Illustrated in FIG. 3(a) is the detailed circuit diagram for driver amplifiers, such as driver amplifier 56. The operations of the transistorized switches Q1, Q2, Q3 and Q4 are well known and obvious to a person of ordinary skill in the art, and a detailed explanation will not be provided. However, one point should be made, when the data enable bit on line 85 is true, driver amplifier 55 will output on signal line 87 the logic state that is appearing on signal line 83, i.e., if line 83 is a logic 1, line 87 will be at a logic level corresponding to the DUT 26 Vcc voltage level, and if at a logic zero, line 87 will also be at a logic zero. On the other hand, if the data enable bit on line 85 is false, neither tri-state buffer 70 nor 2-input AND gate 68 will produce an output in response to the logic signal on line 83. As a result, transistors Q2 and Q4 will be non-conducting and the signal on line 87 will be an open circuit.

The Programmable Sequence Controller 18

Referring again to FIG. 2, a more detailed block diagram of the programmable sequence controller 18 shown in FIG. 1 is illustrated. The programmable sequence controller 18 consists of protocol sequence control unit 28, a buffer memory unit 40, a protocol address counter 44, a data address counter 36, a protocol sequence length memory unit 38 and a synchronization means 42. The protocol address counter 44 and the data address counter 36 function to generate the protocol memory 54 and data memory 52 addresses, respectively. Clocking of these two address counters is by the PSG MCKL* clocking signal derived from the MCKL clock signal from test head controller 14 (see FIG. 1). The protocol sequence length memory unit 38 outputs control information in the form of enabling signals to both the data address counter 36 and the protocol address counter 44 via the synchronization means 42. These signals enable the respective address counters to produce the predetermined sequence of addresses required by the data memory 52 and protocol memory 54 of the driver/receiver boards 22 to produce the data and control test signals. The addressing of the protocol sequence length memory 38 is provided by the output of the protocol address counter 44. In other words, the enabling signals outputted from memory 38 are synchronized with the generation of the protocol control signals.

The protocol address counter 44 data input lines are connected to the output of a buffer memory 40 which contains the starting addresses of the protocol sequences that are to be generated during the test cycle. Buffer memory 40, for the preferred embodiment of the present invention is a first-in first-out (FIFO) memory unit.

Connected between the FIFO 40 and the protocol address counter 44 is the synchronization means 42 which functions to read the contents of the FIFO 40, and when a starting address is present on the output signal lines, to strobe that starting address into the protocol address counter 44. For the preferred embodiment, the protocol address counter generates sequential memory addresses for each protocol sequence beginning at the starting address specified by the contents of the FIFO and continuing until the occurrence of the last address for the sequence memory 40.

The synchronization means 42 produces an UNLOAD clock signal to the FIFO 40 to call up the next starting address. When that address is present on the output signal lines, the signal OUTPUT RDY is generated to the synchronization means 42. At the appropriate time, the synchronization means 42 generates the load clock signal LDAC to the protocol address counter 44 strobing into that counter the current starting address present on the output of the FIFO 40.

The protocol sequence length memory 38 indicates to the synchronization means 42 when the last address in the current protocol sequence is occurring. Protocol sequence length memory 38 has as many memory locations as protocol memory 54 on driver/receiver boards 22, and receives the same addresses. Accordingly, by storing a control bit in the word location corresponding to the last memory address for each protocol sequence, on the occurrence of that address, a logic signal, LAST ADDRESS, will be generated on the output of memory 38 to indicate to the sychronization means 42 that the current protocol sequence has finished, and the next protocol sequence starting address from FIFO 40 can be loaded into the protocol address counter 44.

The protocol sequence length memory 38 outputs 4 enable signals: LAST ADDRESS just mentioned, LISTEN*, DATA ADVANCE, and DATA ENABLE. The function of the LAST ADDRESS is as previously described, to update the protocol address counter 44 with the next starting address for the next protocol sequence to be generated. The function of the LISTEN* signal is as previously discussed with reference to FIG. 1, to selectively enable the functional tester contained in the test head controller 14 to listen and test the signal on the response line 17 during the test cycle. The signal LISTEN* generated by the progammable sequence controller 18 is combined with the internal LISTEN signal generated in the test head controller 14 to control the functional tester 16. The function of the enable signal DATA ADVANCE is to enable the PSG MCKL* clock signal to advance the data address counter 36 one address each time that the DATA ADVANCE signal is true. In other words, data address counter 36 is not in a free-running mode as is the protocol address counter 44. A DATA ADVANCE signal must occur from the protocol sequence length memory 38 for each advance in the data address counter 36.

Finally, the function of the signal DATA ENABLE is to enable the driver means 56 associated with the data memory 52 to further enable the generation of the data test signals according to the data stored in data memory 52. Unlike the driver means 56 associated with the data memory 52 which responds to the DATA ENABLE signals from the protocol sequence length memory 38, the driver means 56 associated with the protocol memory 54 does not receive an enable signal from controller 18 to inhibit the generation of the protocol control signals during the test cycle. Primarily, the function of the DATA ENABLE signal to driver means 56 is to ensure that the driver amplifiers, such as amplifer 55, 57 are generating open circuit signals on their outputs during the time the data bus lines to which they are attached contain signals generated by the device under test. Most data buses serve dual purposes, sometimes carrying addresses and sometimes carrying data. When the driver/receiver boards 22 are to produce digital test signals for the data bus signal lines, the driver means 56 will be enabled by DATA ENABLE. However, when there is to be data on the data bus lines that are not to be generated by the driver/receiver boards 22, the DATA ENBALE will disable driver means 56 to produce the open circuits on the output of the driver amplifiers 55, 57.

Still referring to FIG. 2, programmable sequence controller 18 further includes tri-state buffer units 34 and 35 which buffer the programming data from the CPU 10 into the protocol sequence length memory 38 and protocol control memory 32, which is part of the protocol sequence control unit 28. At the start of the test cycle, the data address counter 36 is always reset to address 0.

Controlling the generation of the various protocol sequences during the test cycle is the protocol sequence control unit 28 which consists of a bit-slice processor 30 and the protocol controller memory 32. Protocol controller memory 32 contains the operational codes or instructions which processor 30 will execute during the test cycle. The memory 32 word length is 16 bits (PCM0–PCM15), with the 4 high order bits (PCM12–PCM15) functioning as the machine executable codes to the processor 30 (see FIG. 7(b)). The lower 11 bits of the protocol controller memory 32 (PCS0–PCM10) contain data needed by processor 30 to execute its instruction, such as the various starting addresses of the protocol sequences to be generated during the test cycle. PCM11 provides a load clock signal to the FIFO 40 when the lower order 10 bits PCM0–PCM9 defines a starting address that is to be loaded into the FIFO memory 40. The processor 30 contains internal addressing circuits which addresses protocol controller memory 32 to output the next instruction to be executed.

The instruction execution speed of the processor 30 is much greater than the rate at which the protocol address counter 44 will generate the predetermined sequences in protocol memory addresses. It is the function of the FIFO 40 to buffer the starting addresses outputted by processor 30 at the higher rate and to inhibit the sequential execution of the instructions by the processor 30 when the FIFO register 40 is full. In this manner, execution of instructions by processor 30 will be on a need basis, with the need being any time that the FIFO register 40 is not full and there are further instructions from the protocol control memory to be executed.

At the completion of the program stored in the protocol controller memory 32, the processor 30 will automatically go to a looping state where no further starting addresses are to be outputted to the FIFO memory 40. In such a case, the FIFO generated signal will enable processor 30 to perform its looping instruction while the contents of the FIFO register 40 continue to be unloaded in response to the completion of each protocol sequence. When the FIFO 40 becomes empty, the OUTPUT RDY signal will no longer produce a true signal in response to the UNLOAD clock from the synchronization means 42. With this occurrence, the synchronization means 42 will not produce a load clock LDAC to the protocol address counter 44, but instead, will generate a HALT signal which is inputted to the test head controller 14. A HALT signal terminates the generation of the current test cycle. For the presently preferred embodiment of the present invention, processor 30 is an Advance Micro Device Model No. Am2910 microcomputer. Information concerning the Am2910 may be found in the publication entitled "The Am2900 Family Data Book with Related Support Circuits" publication No. AM-PUB003 copy-righted 1979 by Advance Micro Devices.

Buffer Memory 40 and Synchronization Means 42

Figure 5:
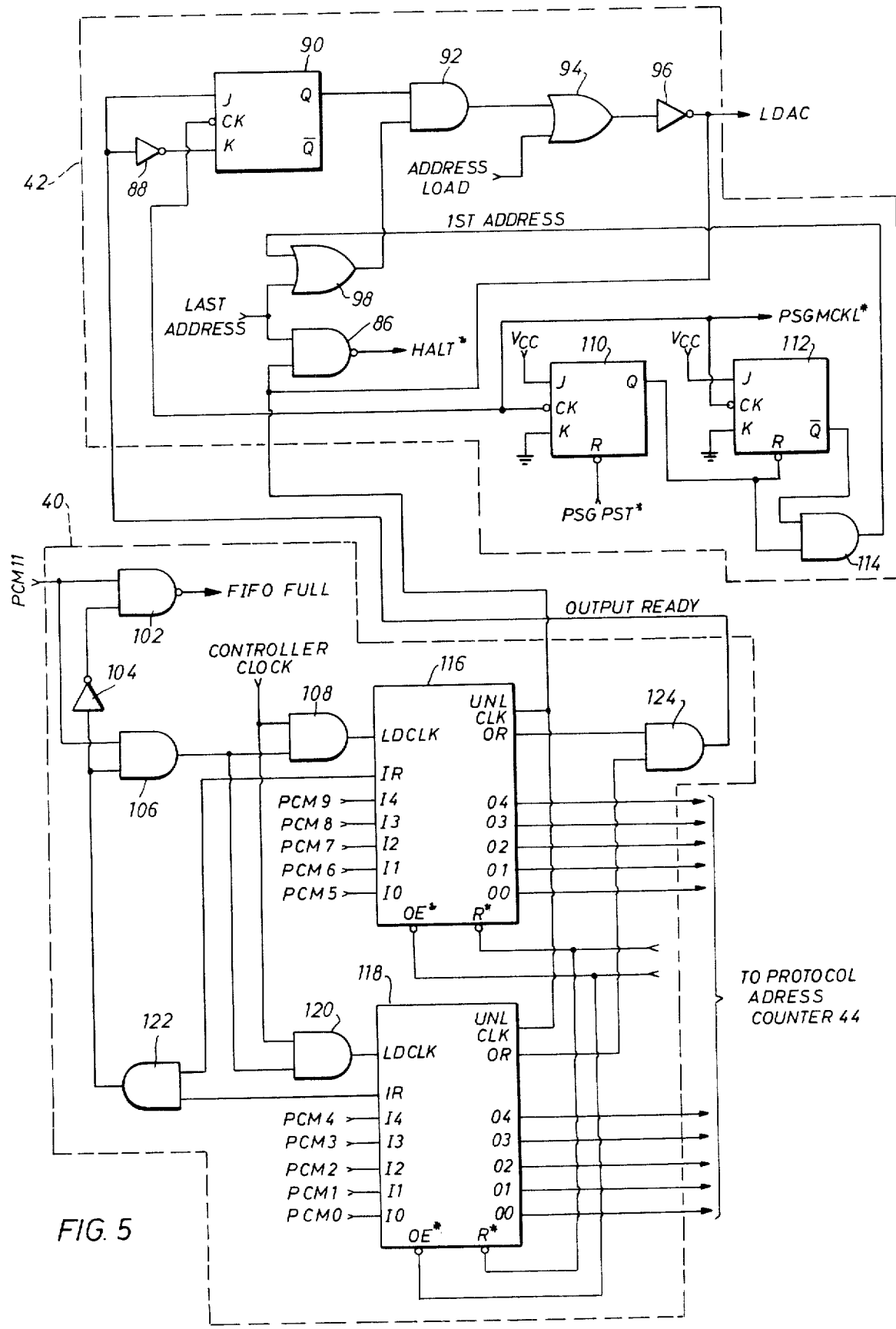
FIG. 5 is detailed circuit diagram of the synchronization means and the buffer memory unit of the controller shown in FIG. 2.

Referring now to FIG. 5, a more detailed circuit diagram of the buffer memory unit 40 and the synchronization means 42 is shown. For the presently preferred embodiment of the present invention, buffer memory 40 consists of two 5-bit FIFO memory units 116 and 118 manufactured and sold by Texas Instruments and their Model SN74S225 connected so as to produce a 10-bit FIFO register. The functioning of these registers are well-known to those of ordinary skill in the art and a detailed discussion will not be provided.

Also illustrated in FIG. 5 is the circuit diagram for the synchronization means 42. At the start of the test cycle, the synchronization means 42 generates the signal 1ST ADDR (first address in the test cycle) on the occurrence of the OUTPUT READY signal from the buffer memory 40, since flip-flop 110 was previously cleared by the occurrence of the PSG DCLR* signal on the reset input prior to the start of the test cycle. With the occurrence of 1ST ADDR, a signal LDAC will be generated to the protocol address counter 44. Flip flop 90 responds to the OUTPUT READY signal from FIFO 40 to provide an enable signal (Q) to AND gate 92.

Depending upon the state of OUTPUT READY, either a load clock signal LDAC to the protocol address counter 44 and the butter memory 40 or the HALT* signal to the test head controller 14 will be generated on the occurrence of the signal LAST ADDRESS from the protocol sequence length memory 38. LAST ADDRESS is inputted to both OR gate 98 and NAND gate 86 of the synchronization means 42. NAND gate 86 generates the HALT* signal while OR gate 98 produces a logic signal that is combined in AND gate 92 with the Q output from flip-flop 90 to produce the load clock LDAC. Thus, if OUTPUT READY is at a logic zero, indicting there are no more starting memory addresses contained in the buffer memory 40, the next occurrence of LAST ADDRESS will generate the signal HALT* to the test head controller 14 to terminate the test cycle.

If the OUTPUT READY signal is at a logic 1, indicating that another protocol sequence is to be generated, on the occurrence of the signal LAST ADDRESS, the signal LDAC will be generated to load that starting address into the protocol address counter 44. To load the very first starting address of the first protocol sequence into the protocol address counter 44, the signal 1ST ADDR is generated at the start of the test cycle. This signal is ANDED with the signal LAST ADDRESS in OR gate 98 to produce the first LDAC load clock to the protocol address counter 44.

A Sample Test Program

The present invention may best be understood by reference to a example test program for exercising a bus oriented device, such as a microprocessor. Referring to FIG. 6(b), a microprocessor manufactured by Intel Corporation as its Model 8085 is illustrated with its input/output control signals and its address/data bus lines indicated. FIG. 6(c) is a timing diagram for the various ones of the input/output signals shown in FIG. 6(b) for four cycles of the processor, a fetch cycle, a reset cycle, a read cycle and a write cycle. FIG. 6(a) illustrates a test program for three instructions written in the assembler language of the microprocessor which is to be simulated by the present invention during a test cycle. During this test cycle, the functional tester 16 will test one of the microprocessor generated input/output signals for a proper response. The first instruction in the microprocessor test program is a move immediate MVI the hexadecimal number 55 to the A accumulator register. The second instruction INR A increments the contents of the A accumulator. The third and final instruction STA B5E3 store the contents of the A accumulator in the memory location having the hexadecimal address B5E3. Also illustrated in FIG. 6(a) are the operation codes that would be stored in the 6 successive main memory locations which the microprocessor would normally access to execute the three instructions of the microprocessor test program.

Turning now to FIG. 7(a), a tester program written in the language of the in-circuit digital tester is illustrated. CPU 10 will convert the tester program instructions into the instructions for processor 30 that will be executed during the test cycle to produce the necessary test signals to cause the microprocessor under test to carry out the microprocessor test program. The processor 30 program is shown in FIG. 7(b) as it would appear in the protocol controller memory 32.

To begin the test, a microprocessor reset cycle is first performed. A reset cycle initializes the internal circuits of the microprocessor. In order for the microprocessor to obtain the first instruction in our test program, a fetch cycle must be performed. The purpose of this instruction is to input to the microprocessor on its address-/data bus the opcode which the internal circuits of the processor will execute. For our microprocessor test program, the first instruction is move immediate the contents of the next memory location following the location containing the move immediate instruction into the accumulator (MVI 55, A). Because the move immediate instruction requires the contents of the next memory location in order to complete the execution of the MVI instruction, a read cycle will follow the fetch cycle for the MVI instruction. The address of the memory location that is to be read during this read cycle is outputted by the microprocessor, while the contents of that specified location (55) will be strobed onto the address/data bus lines by the test signal generated by the present invention. At the completion of the read cycle, the instruction MVI 55, A will have been completed.

The next instruction in the microprocessor test program must now be obtained with a second fetch cycle. Since the instruction INR A will not require any further input or output cycles by the microprocessor, at the completion of the execution of the incrementing of the A accumulator, another fetch cycle must be executed to obtain the third instruction in our test program. In other words, to obtain the second and third instructions, two consecutive fetch cycles must occur. The tester program illustrated in FIG. 7(a) shows this function as a REPEAT FETCH TWO TIMES.

The third instruction is a store the accumulator instruction, STA. This instruction must read the contents of the next two consecutive memory locations following the memory location containing the STA instruction to obtain the address location for the memory location into which the accumulator contents will be stored, B5E3. Accordingly, at the completion of the third fetch cycle obtaining the third instruction in our microprocessor test program, two consecutive read cycles must occur in order to obtain the contents of the second and third memory locations following the instruction. The two read cycles are executed in the tester program upon execution of REPEAT READ TWO TIMES (see FIG. 7(a)). As part of the execution of the STA instruction, a write cycle must be initiated to store the accumulator contents into the specified memory location which, for our example, is B5E3. At the completion of the write cycle, the microprocessor test program will have been completed and the processor 30 will be in a looping condition on the execution of the tester program instruction HALT.

Referring now to FIG. 7(b), the contents of the protocol controller memory 32 is illustrated. The instruction opcode for bits 12 through 15 of the controller memory word is the binary machine executable code for the instructions to be executed by the processor 30. Illustrated opposite the instruction opcodes are the assembler language instructions for processor 30 which are to be executed. The data portion of each protocol controller memory 32 word (bits 0–10) are illustrated in their decimal equivalents. For example, address 0 of the protocol controller memory 32 contains decimal 26 in the data portion of the instruction LOAD FIFO 40. This instruction loads FIFO 40 with the contents of the data portion of the instruction, 26.

FIG. 7(c) illustrates the contents of both the protocol memory 54 and the protocol sequence length memory 38. Since both these memories are addressed by the output of the protocol address counter 44, the data in the two memories are shown side-by-side as a function of the protocol memory addresses. For our example, only the data bits D of the protocol memory 54 (similarly for the data memory 52 shown in FIG. 7(d)) are illustrated since the data enable bits E for the protocol memory are all at a logic 1. While the E enable bits are at a logic 1 for our example, it is possible to cause the control signals and data bus signals to go to an open circuit by making the E enable bit a logic one. This may be desirable when testing certain logic devices, such as a DMA controller to a microprocessor. Some control inputs will need to be stimulated from the in-circuit tester during a portion of a test cycle, and stimulated by the DMA circuit during a different portion of the test cycle. For the protocol/data mode, the digital test signals to be generated by the driver means 56 are to follow the logic state of the data in the memories 52, 54 rather than produce transitions in test signals when the data bits are at a logic 1 (the Gray code mode of operation). Additionally, the four microprocessor cycles illustrated in FIG. 6(c) are stored in the prototcol memory 54 beginning at address 0 and ending at address 33. For the fetch cycle, the starting address is protocol memory address 0 with the last address, protocol memory address 9. Similarly, for the read cycle, the starting address is 10 and the last address is 17, for the write cycle the starting address is 18 and the last address is 25, and for reset cycle the starting address is 26 and the last address is 33.

Referring now to FIG. 7(d), the data stored in data memory 52 is illustrated. The signals on address/data bus lines A0–A7 as shown in FIG. 6(b) will be generated by the data stored in data memory 52. Since the microprocessor is to be tested apart from its main memory, the data memory 52 will generate the data bus signals that the microprocessor believes is coming from its main memory when executing a read cycle or a fetch cycle. Also illustrated in FIG. 7(d) is a hexadecimal equivalent to the binary code contained in the data memory addresses. As can be seen, the hexadecimal equivalent of the data contained in the data memory 52 for addresses 0, 2 and 3 correspond to the opcodes for the microprocessor test program instructions illustrated in FIG. 6(a).

Turning now to FIG. 7(b), the first instruction executed by processor 30 of the protocol sequence control unit 28 is to load FIFO 40 with the starting address for the reset cycle. For our example, the starting address for the reset cycle is address 26. With a starting address now contained in FIFO 40, the synchronization means 42 will load that address 26 into the protocol address counter 44 which immediately causes the protocol mamory 54 and its associated driver means 56 to generate a logic low on the RESET IN* input to the microprocessor under test (test node 3). The protocol address counter 44 will continue to increment its addresses until it reaches the last address 33. At that point, the contents of the protocol sequence length memory 38 will output for the LAST ADDRESS a logic 1 (see FIG. 7(c)) to cause the synchronization means 42 to load the next starting address of the next protocol sequence if OUTPUT READY is true. As previously mentioned, the processor 30 executes the instructions at a much higher speed than the incrementing of the protocol address counter 44 so the next protocol sequence starting address should be contained in FIFO 40 and the OUTPUT READY signal should be true.

Still referring to FIG. 7(b), the contents of the second address location of the protocol controller memory 32 contains the instruction LOAD FIFO 40 with the starting address for the fetch protocol cycle. For our example, this address is decimal 0. The next instruction in the protocol controller memory 32 loads FIFO 40 with the starting address decimal 10 for the read cycle. The instructions contained in the protocol controller memory 32 in address locations 3–5 perform a looping function to produce two fetch cycles in a row. The instruction contained in address 4 loads the FIFO 40 with the starting address for the fetch cycle, which for our example is address 0. The result of the instructions located in addresses 3–5, PUSH/LOAD CNR, LOAD FIFO 40, REP LOOP/CNR 0, is to repeat a fetch cycle two times. Similarly, the instructions contained in address locations 6–8 perform the read cycle for two times.

At the completion of the two read cycles, the protocol controller memory 32 outputs the instruction LOAD FIFO 40 with the starting address for a write cycle, which for our example is address 18. At the completion of that instruction, the protocol controller memory 32 supplies to the processor 30 a jump instruction which causes processor 30 to continually and repeatedly execute the instruction contained in address 10. In other words, the processor is caused to loop on the same instruction indefinitely.

As each instruction of processor 30 is being executed, the protocol address counter is generating the predetermined sequence of protocol mamory address which in turn are causing the sequence length memory 38 to cause the data address counter to generate the predetermined sequence in data memory addresses. As each protocol sequence is completed, FIFO 40 produces a new starting address to the protocol address counter. As long as FIFO 40 is not full, processor 30 will continue to execute its instructions and load FIFO 40 with the starting addresses. Now that starting addresses for the various protocol sequences are loaded into the FIFO 40, the programmable sequence controller 18 will continue to operate as previously described to generate the various protocol sequences until the FIFO 40 is empty and the HALT signal is generated.

To determine that the microprocessor is generating the right response signals as a result of the generation of the input stimulus signals, the protocol sequence length memory 38 outputs a LISTEN signal when there is digital information on the response signal line 17 that the functional tester 16 should respond to. For example, at the start of the fetch, the read and the write cycles, the microprocessor will be outputting onto its address-/data bus lines A0-A7, the address of a memory location (see FIG. 6(c)). This data is a response signal that the functional tester should be testing. Accordingly, the protocol sequence length memory 38 will output a logic 1 for the LISTEN signal to enable the functional tester to monitor the response line 17 at those times. Additionally, in a write cycle, the microprocessor will output data onto the address/data bus A0-A7 during the cycle which is important and should be tested. FIG. 7(c) illustrates when the LISTEN signal is true during each of these cycles.

Referring to FIG. 6(c), for each cycle, the fetch, the read and the write cycle, there is a point in their respective cycles at which data should be placed onto the address/data bus lines A0-A7. At those times, the protocol sequence length memory 38 will output for the DATA ENABLE signal a logic 1 when the driver amplifiers of driver means 56 are to produce digital data signals onto the data bus. Prior to the start of the test cycle, the data address counter 36 will have been reset to address 0. (FIG. 7(d) shows the contents of the various data memory 52 locations.) Even though data memory 52 outputs the contents for address 0, only until the DATA ENABLE signal from protocol sequence length memory 38 goes true will any digital data signals be generated by the driver means 56 associated with the data memory 52. As shown in FIG. 7(c) the contents of data memory 52 at address 0 is applied to the microprocessor for two consecutive memory locations 6 and 7 of the protocol memory 54 corresponding to the fourth cycle of the microprocessor clock signals X1 and X2 during the fetch cycle. DATA ENABLE is true during memory addresses 6 and 7.

At protocol memory address 7, the protocol sequence length memory 38 outputs for the DATA ADDRESS ADVANCE signal a logic 1 permitting the data address counter 36 to increment to the next sequential address, address 1.

The DATA ENABLE signal goes to a logic 0 at the completion of the protocol memory address 7. Even though the data address counter 36 will now be addressing memory location 1 of data memory 52, no digital test signals will be outputted by the driver means 56 because the DATA ENABLE signal is now at a logic 0. The data address counter 36 will not increment to the next sequential address until the next occurrence of a logic 1 for the DATA ADDRESS ADVANCE signal from the protocol sequence length memory 38.

The programmable sequence controller 18 continues to transfer the contents of the FIFO 40 into the protocol address counter 44 to generate the various sequences until the FIFO 40 becomes empty. At that point, the test cycle will have been completed and the contents of the functional tester 16 are transferred to the CPU 10 for further evaluation to determine if the microprocessor has performed correctly.

In describing the invention, reference has been made to preferred embodiment. However, those skilled in the art and familiar with the disclosure of the invention may recognize additions, deletions, substitutions or other modifications which would fall within the purview of the invention as defined in the appended claims.

APPENDIX

PROGRAMMING FOR MMI MODEL PAL 14H4

| ADDRESS (Decimal) | DATA (HEX Format) |
|---|---|
| 0–7 | F F F 3 B F F B |
| 8–15 | 7 F F 7 F F F F |
| 16–23 | F F F F F F F F |
| 24–31 | F F F F F F 3 F |
| 32–39 | F F F 3 F B B F |
| 40–47 | F 7 7 F F F F F |
| 48–55 | F F F F F F F F |
| 56–63 | F F F F F F 3 F |
| 64–71 | F F 3 F B F F F |
| 72–79 | 7 F F F F F F F |
| 80–87 | F F F F F F F F |
| 88–95 | F F F F F F 3 F |
| 96–103 | 3 3 3 3 3 3 3 3 |
| 104–111 | 3 3 3 3 3 3 F F |
| 112–119 | 3 3 F F 3 3 3 3 |
| 120–127 | 3 3 3 3 3 3 3 3 |
| 128–135 | 3 3 3 3 3 3 3 3 |
| 136–143 | 3 3 3 3 3 3 3 3 |
| 144–151 | 3 3 3 3 3 3 3 3 |
| 152–159 | 3 3 3 3 3 3 3 3 |
| 160–167 | 3 3 3 3 3 3 3 3 |
| 168–175 | 3 3 3 3 3 3 3 3 |
| 176–183 | 3 3 3 3 3 3 3 3 |
| 184–191 | 3 3 3 3 3 3 3 3 |
| 192–199 | 3 3 3 3 3 3 3 3 |
| 200–207 | 3 3 3 3 3 3 3 3 |
| 208–215 | 3 3 3 3 3 3 3 3 |
| 216–223 | 3 3 3 3 3 3 3 3 |
| 224–231 | 3 3 3 3 3 3 3 3 |
| 232–239 | 3 3 3 3 3 3 3 3 |
| 240–247 | 3 3 3 3 3 3 3 3 |
| 248–255 | 3 3 3 3 3 3 3 3 |
| 256–263 | F F F C F F F F |
| 264–271 | F F F F F F F F |
| 272–279 | F F F F E F F E |
| 280–287 | D F F D F F C F |
| 288–295 | F F F C F F F F |
| 296–303 | F F F F F F F F |
| 304–311 | F F F F F E E F |
| 312–319 | F D D F F F C F |
| 320–327 | F F C F F F F F |
| 328–335 | F F F F F F F F |
| 336–343 | F F F F E F F F |
| 344–351 | D F F F F F C F |
| 352–359 | C C C C C C C C |
| 360–367 | C C C C C C F F |
| 368–375 | C C F F C C C C |
| 376–383 | C C C C C C C C |
| 384–391 | C C C C C C C C |
| 392–399 | C C C C C C C C |
| 400–407 | C C C C C C C C |
| 408–415 | C C C C C C C C |
| 416–423 | C C C C C C C C |
| 424–431 | C C C C C C C C |

APPENDIX-continued

| PROGRAMMING FOR MMI MODEL PAL 14H4 | |
|---|---|
| ADDRESS (Decimal) | DATA (HEX Format) |
| 432-439 | C C C C C C C |
| 440-447 | C C C C C C C |
| 448-455 | C C C C C C C |
| 456-463 | C C C C C C C |
| 464-471 | C C C C C C C |
| 472-479 | C C C C C C C |
| 480-487 | C C C C C C C |
| 488-495 | C C C C C C C |
| 496-503 | C C C C C C C |
| 504-511 | C C C C C C C |

What is claimed is:

1. A circuit for use in an in-circuit digital tester for generating data bus and control input test signals to test electrical components of a circuit under test, the circuit under test having a plurality of data bus signal lines, comprising:
   (a) a data memory for storing data bus test signal generating data for generating data bus signals for a plurality of data bus signal lines, said data bus signal generating data outputted in response to a predetermined sequence of data memory addresses;
   (b) a control memory for storing control test signal generating data for generating control test signals for a plurality of protocol sequences in which each protocol sequence is defined by a plurality of control test signals generated in response to a predetermined sequence of control memory addresses, each protocol sequence having a starting and a last memory address;
   (c) a controller means, for generating the predetermined sequences of data and control memory addresses to generate selected ones of the protocol sequences and data bus test signals, said controller means selectively enabling the generation of the data bus signals during each protocol sequence; and
   (d) a driver means associated with each said data and said control memory and responsive to the signal generating data from its associated memory, for generating the data bus and protocol sequence control test signals, said driver means associated with said data memory outputting the data bus signals when enabled by said sequence controller means.

2. The circuit of claim 1 wherein said data memory and said control memory each comprise:
   (a) a plurality of first memories, each first memory associated with a test signal to be generated and responsive to the memory addresses from said controller means, for storing and outputting logic level generating data; and
   (b) a second memory associated with each said first memory and responsive to the addresses from said controller means, for storing and outputting signal level enabling data which enables said logic level generating data in the associated said first memory to produce an output signal level from said driver means, said driver means associated with said data memory further enabled by said controller means to enable the logic level and signal level enabling data to generate the data bus test signals.

3. The circuit of claim 2 wherein said controller means further generates a digital mode control signal for controlling the mode of operation of said driver means to
   (a) generate a specific logic level in an output test signal when a specific logic level of the logic level generating data is outputted by said first memory and the mode control signal is at one logic level, and
   (b) generate a logic level transition in an output test signal when a specific logic level of the logic level generating data is outputted by said first memory and the mode control signal is at the opposite logic level.

4. The circuit of claim 1 wherein said controller means comprises:
   (a) a protocol sequence control unit, for executing a sequence of test program instructions whereby the starting address for each protocol sequence to be generated is outputted;
   (b) a buffer memory unit connected to the output of said protocol sequence control unit, for temporarily storing and outputting in an ordered sequence the starting addresses of the protocol sequences, said buffer memory unit generating a run command to said protocol sequence control unit when said buffer memory unit is not full;
   (c) a control memory address counter responsive to the output from said buffer memory, for generating the control memory addresses;
   (d) a sequence length memory responsive to the control memory addresses, for outputting signals to enable the generation of the predetermined sequence of control and data memory addresses;
   (e) a data memory address counter responsive to said sequence length memory for generating the data memory addresses; and
   (f) a synchronization means responsive to said sequence length memory and to said buffer memory unit, for updating said control memory address counter with the starting address of the next protocol sequence to be generated.

5. The circuit of claim 4 wherein said sequence length memory comprises a first random access memory unit which outputs
   (a) a last address signal to enable said control memory address counter to load the next protocol sequence starting address from said buffer memory,
   (b) a data enable signal to selectively enable said data memory to generate the data bus test signals, and
   (c) a data memory address advance signal to enable said data memory address counter to advance to the next data memory address in the predetermined sequence of data memory addresses.

6. The circuit of claim 5 wherein said protocol sequence control unit comprises a programmed processor including a second random access memory unit for storing instructions which, when executed by said processor in response to the run command, will output the starting address of the protocol sequences.

7. The circuit of claims 4 or 6 wherein said buffer memory is a first-in first-out memory unit.

8. In an in-circuit digital testing system adapted for use with a central processing unit, the system testing during a test cycle the electrical performance properties of components in an electrical circuit under test, the circuit under test having a plurality of data bus lines, the system including,
   (a) a response signal line, for monitoring a digital response test signal from the circuit under test, (b) a functional tester, for performing functional test on the response line signal during the test cycle to determine electrical performance properties of the components in the circuit under test, (c) a set of test pins for contacting selected electrical modes of the circuit under test to provide input and output signal points of the circuit under test, (d) a plurality of programmed-memory digital test-signal generators, one generator associated with each test pin, each generator capable of generating an input signal-point digital test signal for the circuit under test, and (e) a response signal selecting means connected to the test pins and responsive to the central processing unit, for connecting the signal on a selected one of the test pins to the response signal line, the improvement in said system comprises an improvement in said programmed-memory digital test-signal generators, comprising:

(a) a plurality of programmable data memories, for storing test signal generating data for generating data bus signals for a plurality of data bus signal lines, each data memory associated with a test pin, and where the bus line test signal generating data is outputted in response to a predetermined sequence of data memory addresses;

(b) a plurality of programmable protocol memories with each protocol memory assocated with a test pin, for storing test signal generating data for generating control test signals for a plurality of protocol sequences in which each protocol sequence is defined by a plurality of control test signals generated in response to a predetermined sequence of protocol memory addresses, each protocol sequence stored in said protocol memories beginning at a starting address and ending with a last address;

(c) a sequence control means responsive to the central processing unit, for generating the predetermined sequences of data and protocol memory addresses whereby selected ones of the protocol sequences and data bus signals are generated during the test cycle, and for selectively enabling the functional tester to test the signal on the response signal line, said controller means selectively enabling the generation of data bus signals during the test cycle; and (d) a driver means connected to the test pins and responsive to the test signal generating data from said data and protocol memories, for generating the input signal-point test signals for testing the circuit under test.

9. A circuit of claim 8 wherein each said data memory and said control memory comprise:

(a) a plurality of first memories, each first memory associated with a test signal to be generated and responsive to the memory addresses from said sequence controller means, for storing and outputting logic level generating data; and (b) a second memory associated with each said first memory and responsive to the addresses from said sequence controller means, for storing and outputting signal level enabling data which enables said logic level generating data in the associated said first memory to produce an output signal level from said driver means, said driver means connected to said data memory further enabled by said sequence controller means to enable the logic level and signal level enabling data to generate the data bus test signals.

10. The circuit of claim 9 wherein said sequence controller means further generates a digital mode control signal for controlling the mode of operation of said driver means to (a) generate a specific logic level in an output test signal when a specific logic level of the logic level generating data is outputted by said first memory and the mode control signal is at one logic level, and (b) generate logic level transition in an output test signal when a specific logic level of the logic level generating data is outputted by said first memory and the mode control signal is at the opposite logic level.

11. The circuit of claim 8 wherein said sequence controller means comprises:

(a) a protocol sequence control unit, for executing a sequence of test program instructions whereby the starting address for each protocol sequence to be generated is outputted;

(b) a buffer memory unit connected to the output of said protocol sequence control unit, for temporarily storing and outputting in an ordered sequence the starting addresses of the protocol sequences, said buffer memory unit generating a run command to said protocol sequence control unit when said buffer memory unit is not full;

(c) a control memory address counter responsive to the output from said buffer memory, for generating the control memory addresses;

(d) a sequence length memory responsive to the control memory addresses, for outputting signals to enable the generation of the predetermined sequence of control and data memory addresses;

(e) a data memory address counter responsive to said sequence length memory for generating the data memory addresses; and (f) a synchronization means responsive to said sequence length memory and to said buffer memory unit, for updating said control memory address counter with the starting address of the next protocol sequence to be generated.

12. The circuit of claim 11 wherein said sequence length memory comprises a first random access memory unit which outputs (a) a last address signal to enable said control memory address counter to load the next protocol sequence starting address from said buffer memory, (b) a data enable signal to selectively enable said data memory to generate the data bus test signals, (c) a data memory address advance signal to enable said data memory address counter to advance to the next data memory address in the predetermined sequence of data memory addresses, and (d) a listen enable signal to enable the functional tester to test the signal on the response signal line.

13. The circuit of claim 12 wherein said protocol sequence control unit comprises a programmed processor including a second random access memory unit for storing instructions which, when executed by said processor in response to the run command, will output the starting address of the protocol sequences.

14. The circuit of claims 11 or 13 wherein said buffer memory is a first-in first-out memory unit.

15. A circuit adapted for use in an automatic computer controlled in-circuit digital tester for testing a digital microprocessor board, the microprocessor operating through a plurality of data bus and control lines having data and control signals thereon, and where a plurality of basic microprocessor operations each occur in response to a plurality of predetermined protocol sequences of control signals, the circuit comprising:
- (a) a data bus signal generator for controllably generating a plurality of data bus signals in the data bus lines, said data bus signal generator including a data memory for storing data bus test signal generating data, and where the data bus signals are selectively enabled during each protocol sequence;
- (b) a controlled signal generator for generating the plurality of protocol sequences of control signals in the control signal lines, said control signal generator including a control memory for storing the control line test signal generating data for each protocol sequence; and
- (c) a control means responsive to the computer for repetitively controlling
    - (i) said control signal generator to generate a sequence of logic levels in the control signals for each protocol sequence, and
    - (ii) said data bus signal generator to selectively generate in timed relationship with the generation of the control signals during each protocol sequence, a sequence of logic levels of the data bus signals, said data bus and control signal generators and said control means cooperating to simulate the normal operations of a microprocessor programmed in a specific manner by selectively generating from among the plurality of protocol sequences the basic microprocessor operations in any order thereby to test the operations of the microprocessor board.

16. The circuit of claim 15 wherein the data bus signal generating data is outputted in response to a predetermined sequence of data memory addresses generated by said control means, said data bus signal generator further including
a driver means associated with said data memory and responsive to the data bus test signal generating data and said control means for generating the data bus signals.

17. The circuit of claim 15 wherein each protocol sequence is generated in response to a predetermined sequence of control memory addresses generated by said control means, with each protocol sequence beginning at a starting address and ending at a last address, said control signal generator further including
a driver means associated with said control memory and responsive to said control means and the control line test signal generating data for generating the control line test signals for each protocol sequence.

18. The circuit of claim 16 wherein said data memory comprises:
- (a) a plurality of first memories, each first memory associated with a data bus signal line and responsive to the data memory addresses for storing and outputting logic level generating data; and
- (b) a second memory associated with each said first memory and responsive to the data memory addresses for storing and outputting signal level enabling data, the outputted logic level generating data and the signal level enabling data cooperating together to produce said output data bus signal from said associated driver means when said driver means is enabled by said control means.

19. The circuit of claim 17 wherein said control memory comprises:
- (a) a plurality of first memories, each first memory associated with a control line test signal to be generated, and each first memory responsive to the control memory addresses for storing and outputting logic level generating data; and
- (b) a second memory associated with each said first memory and responsive to the control memory addresses for storing and outputting signal level enabling data, the outputted logic level generating data and the signal level enabling data cooperating together to produce an output control line signal from said associated driver means.

20. The circuit of claims 18 or 19 wherein said control means further generates a digital mode control signal having a first and a second state for controlling the mode of operation of each said associated driver means to,
- (a) generate a specific logic level in an output test signal when a specific logic level of the logic level generating data is outputted by said first memory and the mode control signal is in the first state, and
- (b) generate a logic level transition in an output test signal when a specific logic level of the logic level generating data is outputted by said first memory and the mode control signal is in the second state.

21. The circuit of claim 15 wherein said controller means comprises:
- (a) a protocol sequence control unit for executing a sequence of test program instructions whereby the starting address for each protocol sequence to be generated is generated;
- (b) a buffer memory unit connected to the output of said protocol sequence control unit for temporarily storing and outputting in an ordered sequence the starting addresses of the protocol sequences;
- (c) a control memory address counter responsive to the output from said buffer memory for generating the control memory addresses;
- (d) a sequence length memory responsive to the control memory addresses for outputting signals to enable the generation of the predetermined sequence of control and data memory addresses;
- (e) a data memory address counter responsive to said sequence length memory for generating the data memory addresses; and
- (f) a synchronization means responsive to said sequence length memory and to said buffer memory unit for updating said control memory address counter with the starting address of the next protocol sequence to be generated.

22. The circuit of claim 21 wherein said sequence length memory comprises a first random access memory unit which outputs:
- (a) a last address signal to enable said control memory address counter to load the next protocol sequence starting address from said buffer memory;
- (b) a data enable signal to selectively enable said data memory to generate the data bus test signals; and
- (c) a data memory address advance signal to enable said data memory address counter to advance to the next data memory address in the predetermined sequence of data memory addresses.

23. The circuit of claim 22 wherein said protocol sequence control unit comprises a programmed microprocessor including a second random access memory unit for generating the starting addresses of the protocol sequences.

24. The circuit of claim 21 wherein said buffer memory is a first-in first-out memory unit.

* * * * *